(12) United States Patent
Lee

(10) Patent No.: US 7,531,858 B2
(45) Date of Patent: May 12, 2009

(54) COMPLEMENTARY METAL OXIDE SEMICONDUCTOR IMAGE SENSOR WITH MULTI-FLOATING DIFFUSION REGION

(75) Inventor: Won-Ho Lee, Ichon-shi (KR)

(73) Assignee: MagnaChip Semiconductor, Ltd., Chungcheonbuk-Do (KR)

( * ) Notice: Subject to any disclaimer, the term of this patent is extended or adjusted under 35 U.S.C. 154(b) by 952 days.

(21) Appl. No.: 10/746,521

(22) Filed: Dec. 23, 2003

(65) Prior Publication Data
US 2004/0218078 A1 Nov. 4, 2004

(30) Foreign Application Priority Data
Apr. 30, 2003 (KR) .................. 10-2003-0027823

(51) Int. Cl.
*H01L 31/062* (2006.01)
(52) U.S. Cl. .................. 257/292; 257/E27.131; 257/E27.133
(58) Field of Classification Search .................. 257/292, 257/E27.131, E27.133
See application file for complete search history.

(56) References Cited

U.S. PATENT DOCUMENTS 6,160,281 A * 12/2000 Guidash .................. 257/292
6,215,113 B1 * 4/2001 Chen et al. .................. 250/208.1
6,633,334 B1 * 10/2003 Sakurai et al. .................. 348/308
6,724,426 B1 * 4/2004 Berezin et al. .................. 348/308

FOREIGN PATENT DOCUMENTS

KR 1020010057856 7/2001

* cited by examiner

*Primary Examiner*—Thanh V Pham
*Assistant Examiner*—Mohammad T Karimy
(74) *Attorney, Agent, or Firm*—Blakely, Sokoloff, Taylor & Zafman LLP

(57) ABSTRACT

The present invention relates to a complementary metal oxide semiconductor (CMOS) image sensor. Particularly, a unit pixel of the complementary metal oxide semiconductor (CMOS) image sensor, wherein the unit pixel has a rectangular shape and is defined with the top region and the bottom region of which area is larger than that of the top region, the unit pixel including: a photodiode region disposed in entire areas of a bottom region of the unit pixel; a reset gate, a drive gate and a selection gate disposed in an upper part of a top region of the unit pixel; a multi-floating diffusion region disposed with a uniform size at least at two corners of the photodiode region; and a transfer gate disposed in an upper part of the photodiode region to thereby define the multi-floating diffusion region.

3 Claims, 9 Drawing Sheets

COMPLEMENTARY METAL OXIDE SEMICONDUCTOR IMAGE SENSOR WITH MULTI-FLOATING DIFFUSION REGION

FIELD OF THE INVENTION

The present invention relates to a complementary metal oxide semiconductor (CMOS) image sensor; and, more particularly, to a CMOS image sensor with multi-floating diffusion region.

DESCRIPTION OF RELATED ARTS

Generally, a complementary metal oxide semiconductor (CMOS) image sensor is a semiconductor device that converts an optical image into an electric signal. The CMOS image sensor includes a photo-detection unit for detecting a light and a logic circuit for processing the detected light into an electric signal, which is, in turn, converted into a corresponding datum. The CMOS technology adopts a switching mode, wherein outputs are sequentially detected by using MOS transistors made with the same number as that of pixels.

FIG. 1 is an equivalent circuit diagram showing a unit pixel of a conventional CMOS image sensor.

As shown, a unit pixel 100 includes one photodiode 112 which is a device for collecting lights and four N-channel metal oxide semiconductor (NMOS) transistors such as a transfer transistor 114, a reset transistor 116, a drive transistor 118 and a selection transistor 120. In more detail, the transfer transistor 114 transfers the collected light at the photodiode 112 to a floating diffusion node 122. The reset transistor 116 sets the floating diffusion node 122 with an intended electric potential value and then resets the floating diffusion node 122 with an electric potential value by discharging the photo-generated electric charge. The drive transistor 118 serves as a source follower buffer amplifier, and the selection transistor 120 selectively outputs the electric potential value corresponding to the photo-generated electric charge.

FIG. 2 is a top view of the unit pixel of the conventional CMOS image sensor.

As shown, a gate electrode 114A of the transfer transistor 114 (hereinafter referred to as the transfer gate) is formed such that one side of the gate electrode 114A is overlapped with a predetermined portion of an active region in which the photodiode 112 will be formed. At the other side of the transfer gate 114A, the floating diffusion region 122 is formed. Herein, a pathway from the photodiode 112 to the floating diffusion region 122 is reduced like a bottle neck since the photodiode 112 has a relatively larger area than the other elements do. A gate electrode 116A of the reset transistor 116 (hereinafter referred to as the reset gate), a gate electrode 118A of the drive transistor 118 (hereinafter referred to as the drive gate), a gate electrode 120A of the selection transistor 120 (hereinafter referred to as the selection gate) are arranged with a predetermined distance in a counter-clockwise direction from the floating diffusion region 122.

FIG. 3 is a diagram showing a depleted state of the conventional photodiode.

As shown, if it is assumed that r is a distance within an effective range of a supply voltage (VDD) driving force transferring photo-generated electrons by a VDD, some photo-generated electrons cannot be transferred to the photodiode 112 because of a longer distance r from the transfer gate 114A. Thus, there is generated a photo-generated electron dead zone Y in which the non-transferred photo-generated electrons exist. That is, after the photo-generated electrons are stored into the photodiode 112, the transfer gate 114A is turned on to transfer the stored photo-generated electrons from the photodiode 112 to the floating diffusion region 122. All of those photo-generated electrons existing in the photo-generated electron dead zone Y, which is the region mostly away from a channel region of the transfer transistor 114, are hardly transferred. Thus, the non-transferred photo-generated electrons remain as redundant electrons in the photodiode 112.

However, these redundant electrons can be a source of a dark signal and distortion of an image signal since they serve as the stored photo-generated electrons in the photodiode during a subsequent image processing. These dark signal and distorted image signal degrade sensitivity of the CMOS image sensor and may simultaneously induce distortion of image data.

SUMMARY OF THE INVENTION

It is, therefore, an object of the present invention to provide a complementary metal oxide semiconductor (CMOS) image sensor having a photodiode with a reduced area of a photo-generated electron dead zone.

In accordance with an aspect of the present invention, there is provided a unit pixel of a complementary metal oxide semiconductor (CMOS) image sensor, wherein the unit pixel has a rectangular shape and is defined with the top region and the bottom region of which area is larger than that of the top region, the unit pixel including: a photodiode region disposed in entire areas of a bottom region of the unit pixel; a reset gate, a drive gate and a selection gate disposed in an upper part of a top region of the unit pixel; a multi-floating diffusion region disposed with a uniform size at least at two corners of the photodiode region; and a transfer gate disposed in an upper part of the photodiode region to thereby define the multi-floating diffusion region.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, detailed descriptions on variously applicable preferred embodiments of the present invention will be provided with reference to the accompanying drawings.

In a complementary metal oxide semiconductor (CMOS) image sensor fabricated based on the preferred embodiments of the present invention, photo-generated electron transferring efficiency is improved by eliminating a photo-generated electron dead zone in which redundant photo-generated electrons in a photodiode exist, and capacitance of a floating diffusion region used as a charge sensing node is reduced to pronounce a voltage change so that sensitivity of the CMOS image sensor is improved. That is, the capacitance of the floating diffusion region is reduced to pronounce the voltage change, so that the photo-generated electrons can be effectively transferred from the photodiode to the floating diffusion region. Particularly, the following mathematical equation shows a relationship between the voltage change and the capacitance of the floating diffusion region.

$$\Delta V = qNC_{FD} \qquad \text{Eq. 1}$$

Herein, q, N, ΔV and $C_{FD}$ express a quantity of charges, the number of transferred photo-generated electrons, a voltage change and a capacitance of the floating diffusion region, respectively.

Figure 1:
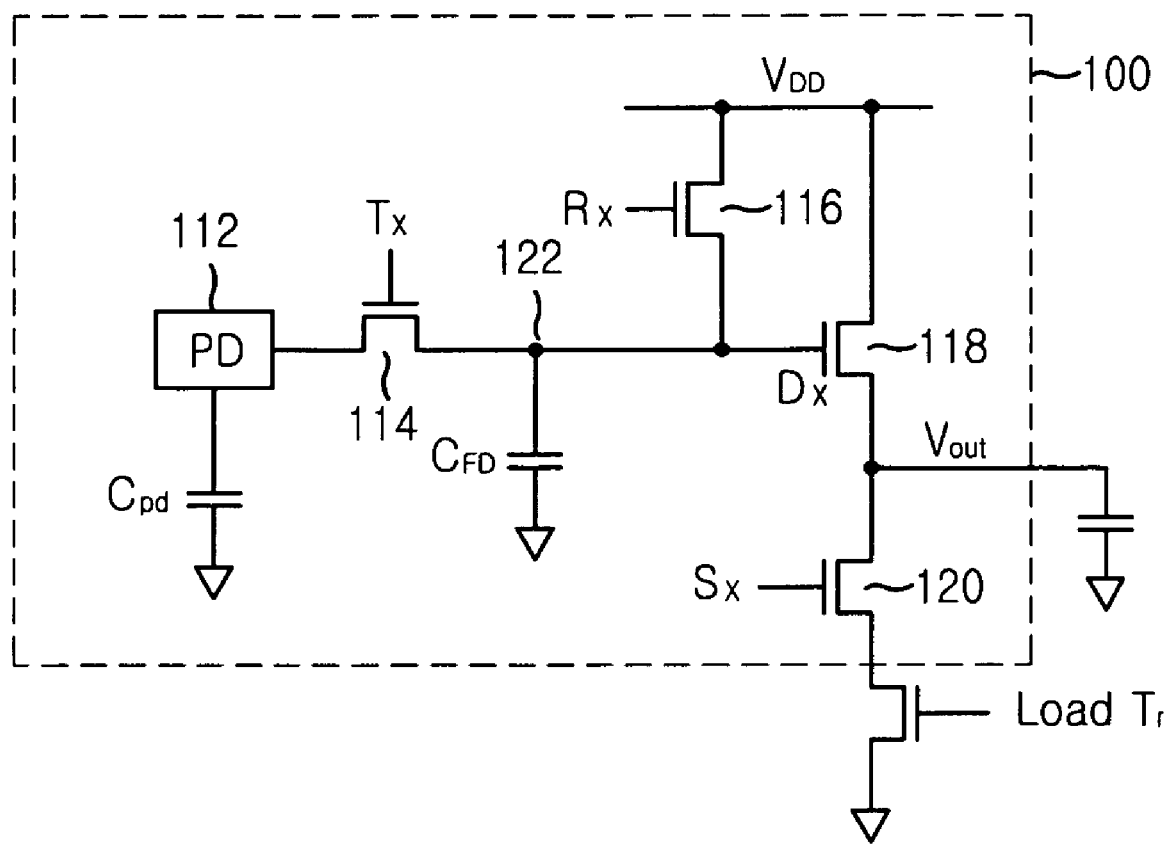
FIG. 1 is an equivalent circuit diagram showing a unit pixel of a conventional complementary metal oxide semiconductor (CMOS) image sensor.
Figure 2:
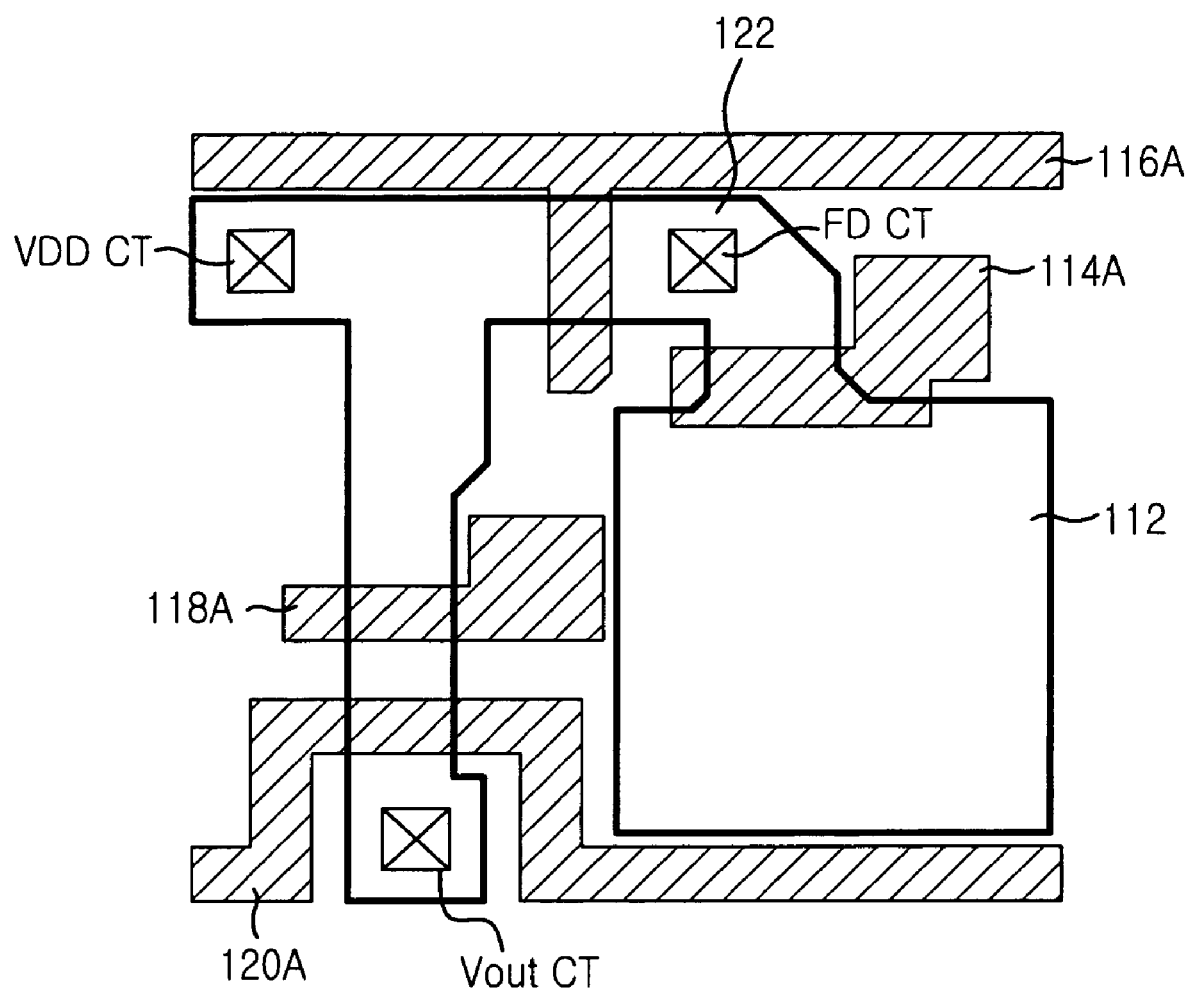
FIG. 2 is a top view of the unit pixel of the CMOS image sensor shown in FIG. 1.
Figure 3:
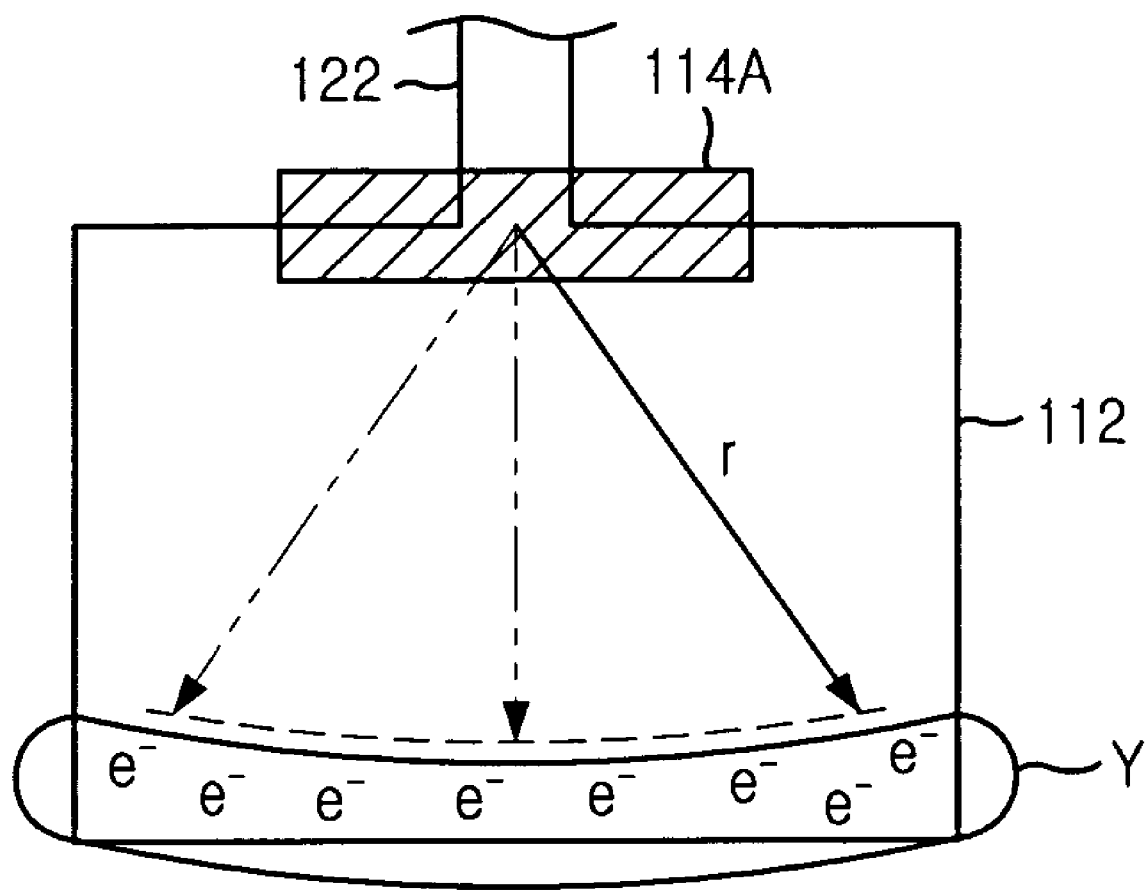
FIG. 3 is a diagram showing a depleted state of a conventional photodiode.
Figure 4:
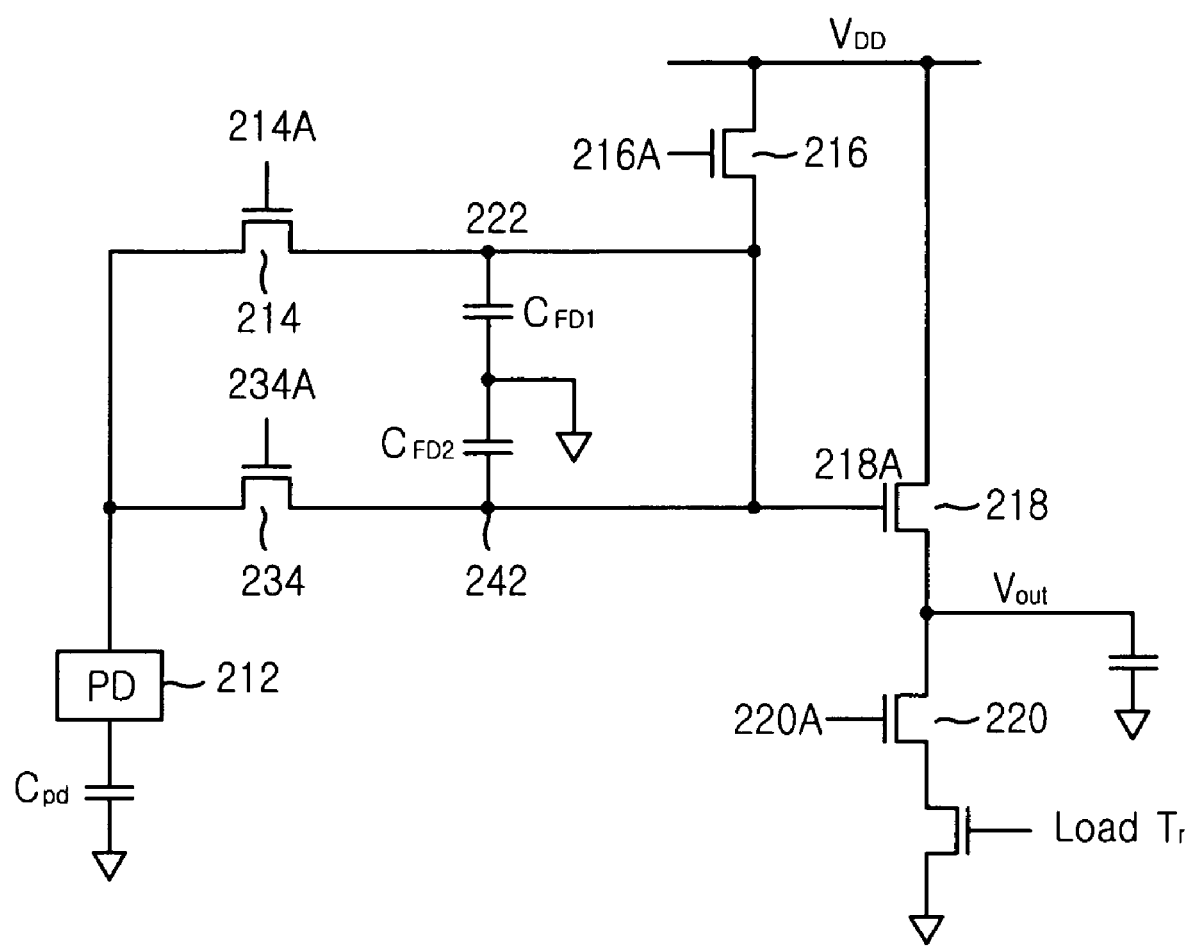
FIG. 4 is an equivalent circuit diagram of a unit pixel of a CMOS image sensor in accordance with a first preferred embodiment of the present invention.

FIG. 4 is an equivalent circuit diagram showing a unit pixel of a CMOS image sensor in accordance with a first preferred embodiment of the present invention.

As shown, the unit pixel includes a photodiode 212 for generating photo-electrons (hereinafter referred to as the photo-generated electrons) by collecting incident lights and storing them thereafter, a first and a second transfer transistors 214 and 234 for transferring the photo-generated electrons stored in the photodiode 212, a first and a second floating diffusion regions 222 and 242 for storing the photo-generated electrons transferred from the photodiode 212 as the first and the second transfer transistors are turned on, a reset transistor 216 for resetting the first and the second floating diffusion regions 222 and 242 with an electric potential by discharging the stored photo-generated electrons in the photodiode 212, a drive transistor 218 for serving as a source-follower buffer amplifier and a selection transistor 220 for performing a switching and an addressing functions.

In more detail of the aforementioned transistors, the first and the second transfer transistors 214 and 234 are respectively connected to the first and the second floating diffusion regions 222 and 242 to transfer the photo-generated electrons from the photodiode 212 to the first and the second floating diffusion regions 222 and 242. The drive transistor 218 is connected between a supply voltage VDD and an output node Vout and has a gate 218A performing a source-follower function by being commonly connected to the first and the second floating diffusion region 222 and 242. The reset transistor 216 is connected between the supply voltage VDD and the gate 218A of the drive transistor 218 (hereinafter referred to as the drive gate), and the selection transistor 220 is connected between the drive transistor 218 and the output node Vout.

Herein, photo-generated electrons are transferred from the photodiode 212 by the two turned-on transfer transistors, i.e., the first and the second transfer transistors 214 and 234, and are stored into the two floating diffusion regions, i.e., the first and the second floating diffusion regions 222 and 242. The reset transistor 216 and the drive transistor 218 are commonly supplied with the supply voltage VDD.

Hereinafter, a method for driving the above described unit pixel will be explained in detail.

First, the first and the second transfer transistors 214 and 234, the reset transistor 216 and the selection transistor 220 are turned off. At this time, the photodiode 212 is assumed to be in a complete depletion state.

Next, the photodiode generates photo-generated electrons. Afterwards, the first and the second floating diffusion regions 222 and 242 are reset by supplying a logic high signal to a gate 216A of the reset transistor 216 (hereinafter referred to as the reset gate). The unit pixel is then turned on by supplying a logic high signal to a gate 220A of the selection transistor 220 (hereinafter referred to as the selection gate 220A), and a first output voltage V1 of the source-follower buffer is measured thereafter. This output voltage V1 means a shift of a direct current (DC) level in the first and the second floating diffusion regions 222 and 242.

Afterwards, the first and the second transfer transistors 214 and 234 are turned off by supplying a logic low signal to a gate 214A of the first transfer transistor 214 (hereinafter referred to as the first transfer gate 214A) and a gate 234A of the second transfer transistor 234 (hereinafter referred to as the second transfer gate). A second output voltage V2 of the source-follower buffer is then measured.

Eventually, a difference in the first and the second output voltages V1 and V2 expresses a voltage generated by the photo-generated electrons collected at the photodiode 212, and this voltage difference is a sole signal value without being affected by noises. This method is called correlated double sampling (CDS).

Figure 5:
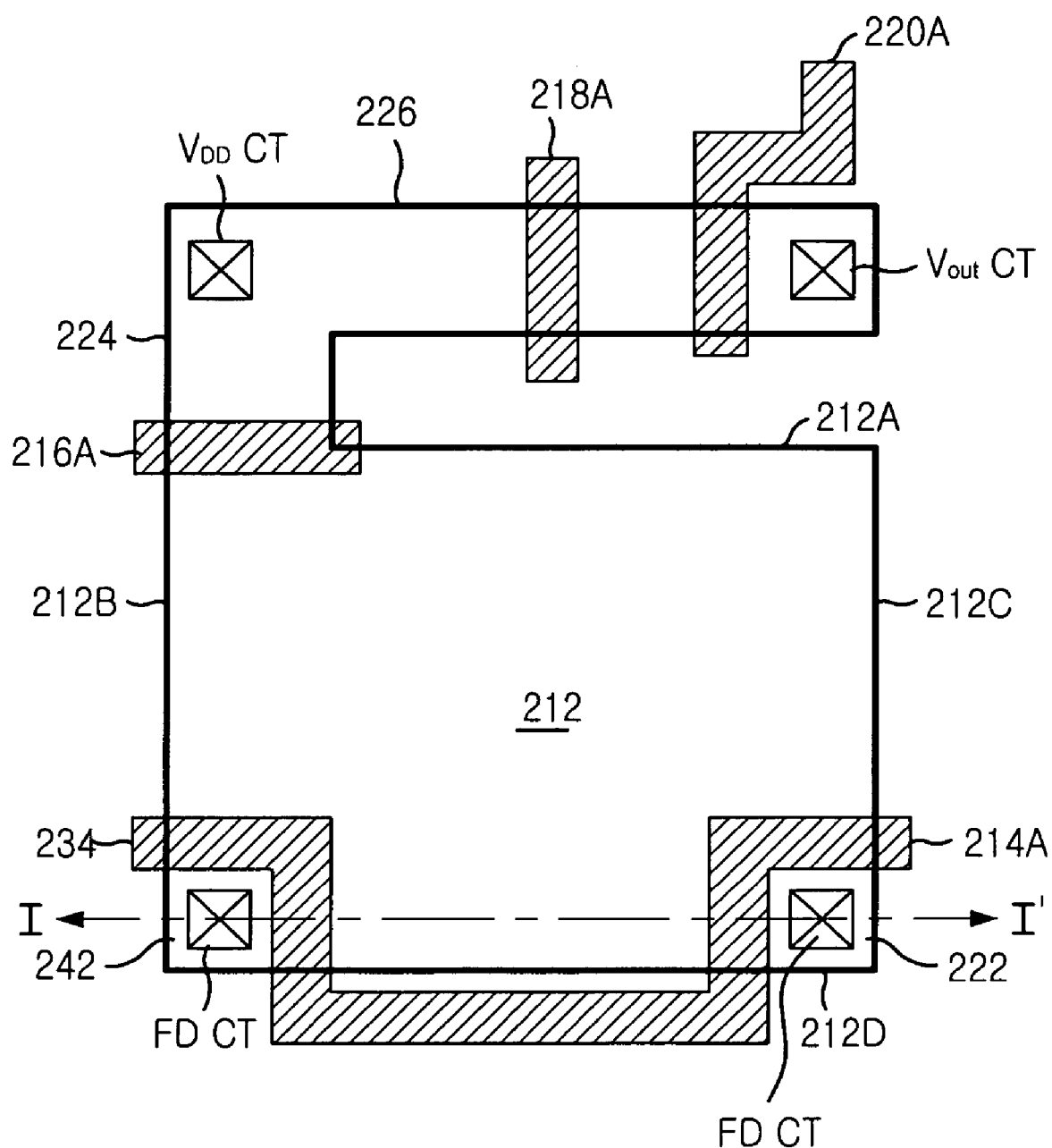
FIG. 5 is a top view of the CMOS image sensor shown in FIG. 4.

FIG. 5 is a top view showing the unit pixel of the CMOS image sensor in accordance with the first preferred embodiment of the present invention.

As shown, a rectangular unit pixel is defined with a top region and a bottom region. The bottom region has a larger area than the top region does, and particularly, the photodiode 212 is disposed almost entirely in the bottom region. In the top region of the unit pixel, the reset transistor 216, the drive transistor 218 and the selection transistor 220 are formed. In a lower portion of the bottom region, i.e., in an edge portion of the photodiode 212, the first and the second transfer transistors 214 and 234 are formed.

More specifically, in the rectangular unit pixel, the photodiode 212 has a rectangular shape with four sides 212A, 212B, 212C and 212D. Herein, the numeral references 212A, 212B, 212C and 212D represent a first side, a second side, a third side and a fourth side of the photodiode 212, respectively. Also, the unit pixel includes the first and the second transfer transistors 214 and 234 disposed in both edges of a bottom part of the photodiode 212 to thereby define the first and the second floating diffusion regions 222 and 242 in each edge of the bottom part of the photodiode 212. In the unit pixel, there are a first active region 224 contacting to one end of the first side 212A of the photodiode 212 and having one side aligned to the second side 212B of the photodiode 212 adjacent to the first side 212A of the photodiode 212 and a second active region 226 contacting to the other side of the first active region 224, being disposed in parallel to the first side 212A of the photodiode 212 and having one end aligned to the third side 212C of the photodiode 212 contacted to the first side 212A. Especially, the first active region 224 is supplied with the supply voltage VDD, and the second active region 226 outputs the photo-generated electrons as an electric signal.

Furthermore, the reset gate 216A is formed in an upper boundary region between the first active region 224 and the first side 212A of the photodiode 212. The drive gate 218A and the selection gate 220A are formed in an upper part of the second active region 226. Particularly, the drive gate 218A and the selection gate 220A are disposed in parallel in a direction of crossing the second active region 226. Also, an output node contact Vout CT is connected to an end portion of the second active region 226 through the selection gate 220A. A supply voltage contact VDD CT for supplying a power voltage is connected to an end portion of the first active region 224 contacted to the second active region 226.

In FIG. 5, the drive gate 218A and the selection gate 220A are particularly disposed with a predetermined length allowing the drive gate 218A and the selection gate 220A to cross the upper part of the second active region 226. Two floating diffusion contacts FDCTs make a respective contact with the first and the second floating diffusion regions 222 and 242 defined in the both ends of the photodiode 212 by the first and the second transfer gates 214A and 234A. Each floating diffusion contact FDCT is connected with the drive gate 218A.

The first and the second transfer gates 214A and 234A determine the size of the first and the second floating diffusion regions 222 and 242. The first and the second transfer gates 214A and 234A have an integral structure dividing the bottom edge part of the photodiode 212 into each section with the uniform size. Thus, each of the first and the second floating diffusion regions 222 and 242 is formed with a predetermined size at each corner of the bottom part of the photodiode 212.

As described above, the photodiode 212, the first and the second active regions 224 and 226 have a rectangular shape. The photodiode 212 occupies most areas of the rectangular unit pixel, while the reset gate 216A, the drive gate 218A and the selection gate 220A occupy the top region of the unit pixel. Thus, a fill factor, which is a ratio of the photodiode area with respect to the total area of the unit pixel, is increased.

Figure 6:
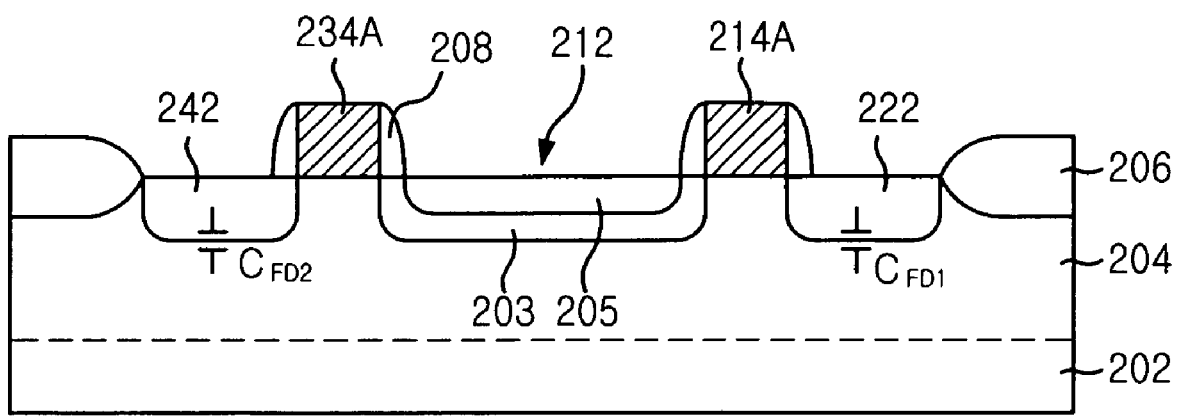
FIG. 6 is a cross-sectional view of the CMOS image sensor in a direction of the line I-I' shown in FIG. 5.

FIG. 6 is a cross-sectional view of the unit pixel of the CMOS image sensor in a direction of the line I-I' shown in FIG. 5.

As shown, a p-type epitaxial layer 204 is formed on a p-type substrate 202, and a device isolation layer 206 is formed on a predetermined surface of the p-type epitaxial layer 204. The first and the second transfer gates 214A and 234A each having a spacer 208 are formed with a predetermine distance on the p-type epitaxial layer 204. Herein, the first and the second transfer gates 214A and 234A have an integral structure by being connected with each other.

Also, the photodiode 212 including a deep n-type diffusion layer 203 and a shallow p-type diffusion layer 205 is formed in a portion of the p-type epitaxial layer 204 disposed between the first and the second transfer gates 214A and 234A. The first and the second floating diffusion regions 222 and 242 are respectively formed on one side of each of the first and the second transfer gates 214A and 234A. Herein, the first and the second floating diffusion regions 222 and 242 are ion-implanted with an n-type dopant. Also, the deep n-type diffusion layer 203 is aligned to one edge of each of the first and the second transfer gates 214A and 234A. The first and the second floating diffusion regions 222 and 242 are aligned to each the other edge of the first and the second transfer gates 214A and 234A, respectively. The p-type diffusion layer 205 is aligned to one edge of each spacer 208.

As shown in FIG. 6, the first and the second floating diffusion region 222 and 242 are connected to each other through the p-type epitaxial layer 204. As a result of this connection, the total capacitance of the first and the second diffusion regions 222 and 242 is decreased by about one-half. This relationship can be expressed in the following mathematical equation.

$$C_{total} = \frac{C_{FD}}{2} \quad \text{Eq. 1}$$

Herein, the $C_{total}$ and $C_{FD}$ express the total capacitance of the floating diffusion regions and the capacitance of each floating diffusion region, respectively.

Figure 7:
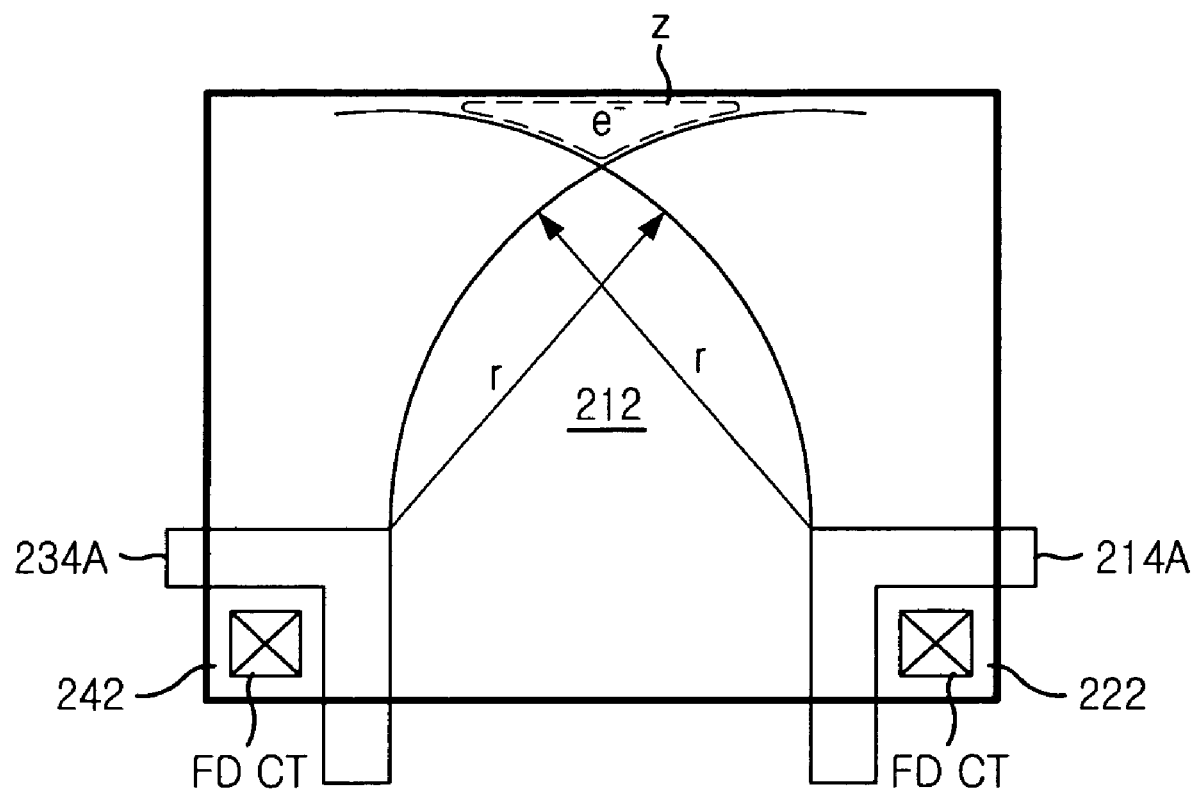
FIG. 7 is a diagram showing a depletion degree of a photodiode in accordance with the first preferred embodiment of the present invention.

FIG. 7 is a diagram showing a depletion degree of the photodiode in accordance with the first preferred embodiment of the present invention.

As shown, since the first and the second transfer gates 214A and 234A respectively are formed in each corner of the bottom part of the photodiode 212, a photo-generated electron dead zone z is hardly formed. That is, because of the first and the second transfer gates 214A and 234A, entire regions of the photodiode 212 are within an effective range of a distance r at which a driving force transferring photo-generated electrons by a supply voltage VDD can reach. Thus, the generation of the photo-generated electron dead zone z is minimized, thereby improving efficiency on photo-generated electron transferring.

Also, the first and the second floating diffusion regions 222 and 242 are electrically connected through the p-type epitaxial layer 204, and this connection of the first and second floating diffusion regions 222 and 242 provides the same effect when they are connected in series. As a result, the total capacitance of the first and the second floating diffusion regions is decreased by one-half, and thus, it is much advantageous to secure a dynamic range of the CMOS image sensor.

Figure 8:
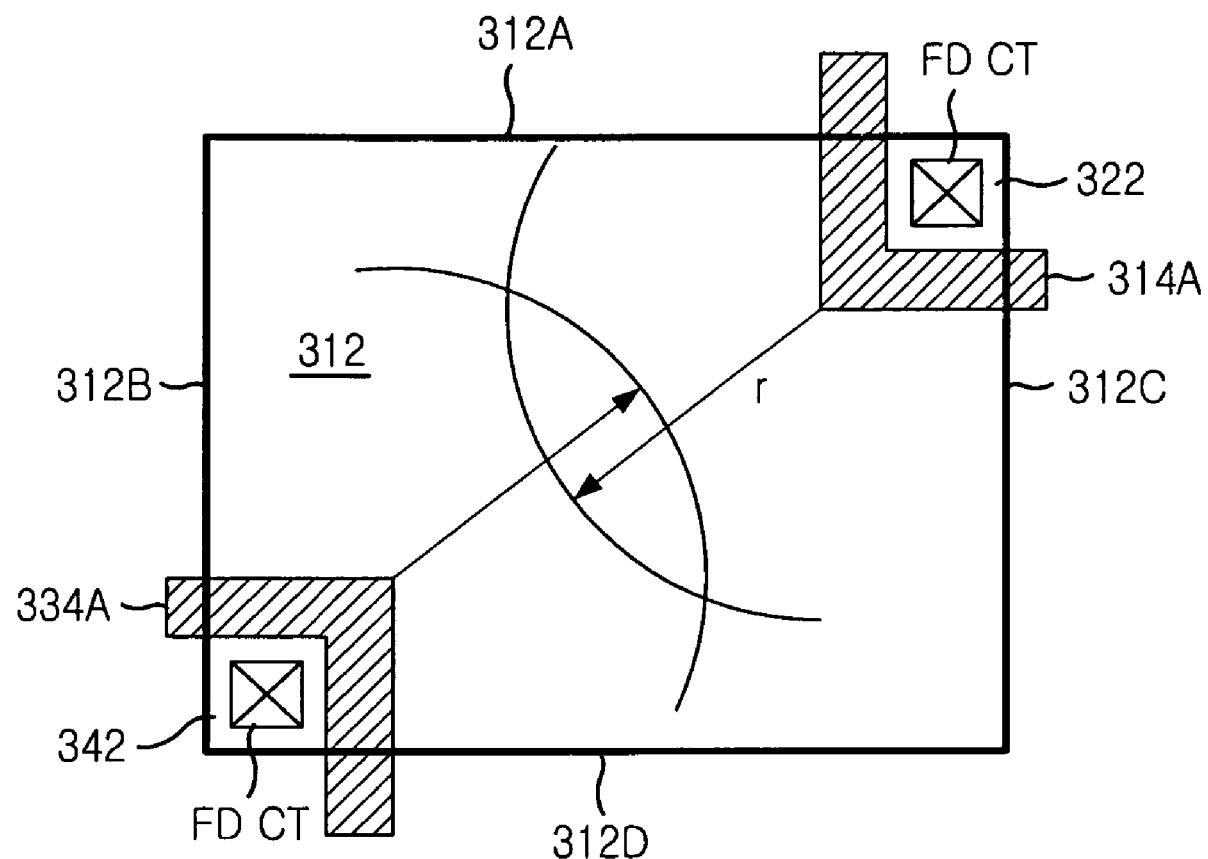
FIG. 8 is a top view of a CMOS image sensor in accordance with a second preferred embodiment of the present invention.

FIG. 8 is a top view of a CMOS image sensor in accordance with a second preferred embodiment of the present invention.

In the second preferred embodiment, a first active region in which a reset transistor is formed and a second active region in which a drive transistor and a selection transistor are formed are identically formed as described in the first preferred embodiment except for another active region in which a photodiode 312 is formed. Thus, detailed descriptions on the formation of the first and the second active regions will be omitted.

As shown, the photodiode 312 has a rectangular shape by having four sides. Herein, the numeral references 312A to 312D denote a first side to a fourth side of the photodiode 312. A first transfer gate 314A and a second transfer gate 334A are formed such that a first floating diffusion region 322 and a second floating diffusion region 342 are formed at diagonally positioned corners of the photodiode 312. That is, the first floating diffusion region 322 is formed at a corner where the first side 312A and the third side 312C of the photodiode 312 meet, while the second floating diffusion region 342 is formed at a corner where the second side 312B ad the fourth side 312D of the photodiode meet. The first and the second transfer gates 314A and the 334A determine the size of the first and the second floating diffusion regions 322 and 342. Each of the first and the second transfer gates 314A and 334A divides each of the above mentioned corners with a uniform size. Therefore, the first and the second floating diffusion regions 322 and 342 are formed respectively at the two diagonally positioned corners of the photodiode 312 with the uniform size. Meanwhile, each of the first and the second floating diffusion regions 322 and 342 makes a contact to each of floating diffusion contacts FDCTS, which are connected to the drive gate (not shown).

In the second preferred embodiment, since the first and the second transfer gates 314A and 334A are formed diagonally at the two corners of the photodiode 312, entire regions of the photodiode 312 are within an effective range of a distance r at which a driving force transferring photo-generated electrons by a supply voltage VDD can reach. Thus, generation of the photo-generated electron dead zone z can be minimized.

Figure 9A:
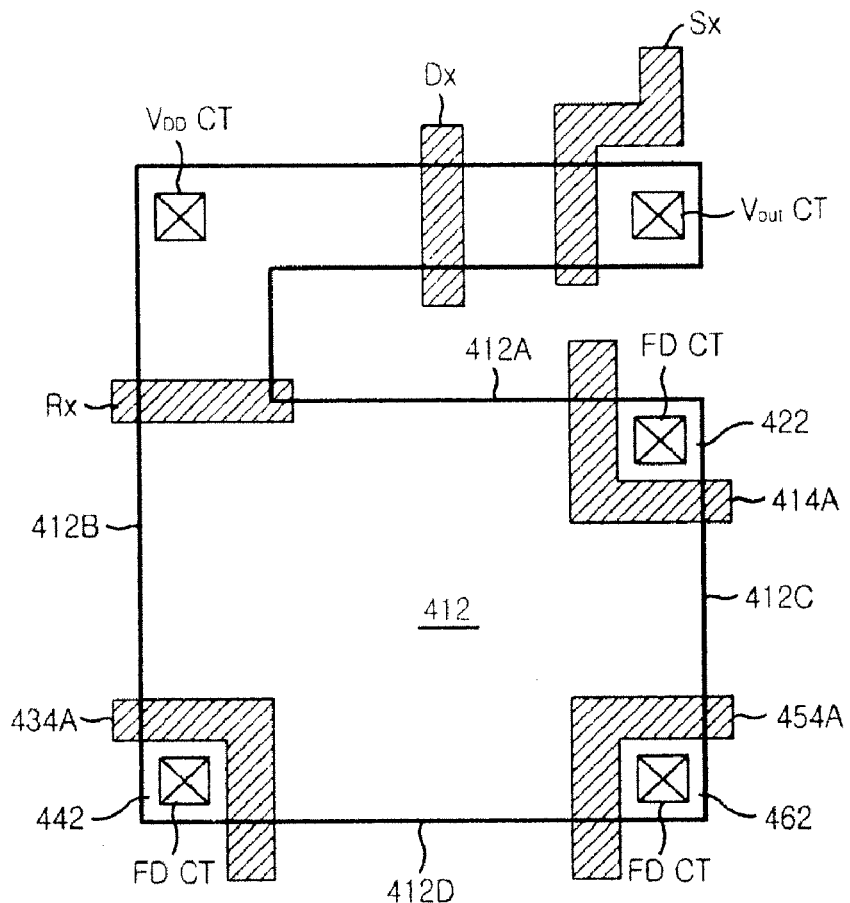
FIG. 9A is a top view of a CMOS image sensor in accordance with a third preferred embodiment of the present invention.

FIG. 9A is a top view of a CMOS image sensor in accordance with a third preferred embodiment of the present invention.

In the third preferred embodiment, a first active region in which a reset transistor is formed and a second active region in which a drive transistor and a selection transistor are formed are identically formed as described in the first preferred embodiment except for another active region in which a photodiode 412 is formed. Thus, detailed descriptions on the formation of the first and the second active regions will be omitted.

As shown, the photodiode 412 has a rectangular shape by having four sides. Herein, the numeral references 412A to 412D denote a first side to a fourth side of the photodiode 412. A first transfer gate 414A, a second transfer gate 434A and a third transfer gate 454A are formed such that a first floating diffusion region 422, a second floating diffusion region 442 and a third floating diffusion region 462 are formed at corners of the photodiode 412 except for a corner contacting to the first active region of the photodiode 412. That is, the first floating diffusion region 422 is formed at a corner where the first side 412A and the third side 412C meet. The second floating diffusion region 442 is formed at a corner where the second side 412B and the fourth side 412D meet. The third floating diffusion region 462 is formed at a corner where the third side 412C and the fourth side 412D meet. The first to the third transfer gates 414A, 434A and 454A determine the size of the first to the third floating diffusion regions 422, 442 and 462. Each of the first to the third transfer gates 414A, 434A and 454A divides each of the above mentioned corners with a uniform size. Therefore, the first to the third floating diffusion regions 422, 442 and 462 are formed respectively at the corners of the photodiode 412 with the uniform size. Meanwhile, each of the first to the third floating diffusion regions 422, 442 and 462 makes a contact to each of floating diffusion contacts FDCTs, which are connected to the drive gate (not shown).

In the third preferred embodiment, since the first to the third transfer gates 414A, 434A and 454A are formed at the three corners of the photodiode 412, entire regions of the photodiode 412 are within an effective range of a distance r at which a driving force transferring photo-generated electrons by a supply voltage VDD can reach. Thus, generation of the photo-generated electron dead zone z can be minimized.

Figure 9B:
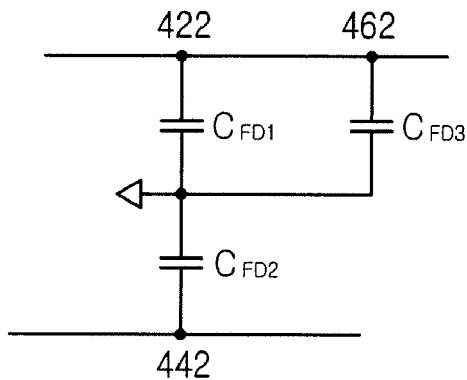
FIG. 9B is an equivalent circuit diagram of the CMOS image sensor shown in FIG. 9A.

FIG. 9B is an equivalent circuit diagram of the unit pixel in accordance with the third preferred embodiment of the present invention.

The first to the third floating diffusion regions 422, 442 and 462 are electrically connected to each other through a p-type epitaxial layer. Among these first, second and third floating diffusion regions 422, 442 and 462, the first floating diffusion region 422 and the third floating diffusion region 462 are connected in parallel, while the first floating diffusion region 422 and the second floating diffusion region 442 are connected in series. Therefore, the total capacitance of the floating diffusion regions is two-third of the capacitance of each floating diffusion region. This relationship can be expressed in a mathematical equation as follows.

$$\frac{1}{C_{total}} = \frac{1}{2C_{FD}} + \frac{1}{C_{FD}} = \frac{3}{2C_{FD}}$$ Eq. 2

Thus, $C_{total} = \frac{2}{3} C_{FD}$

Herein, the $C_{total}$ and $C_{FD}$ are a total capacitance of the floating diffusion regions and a capacitance of the floating diffusion region, respectively.

Compared to the first and the second preferred embodiments, the generation of the photo-generated electron dead zone z is significantly minimized in the third preferred embodiment of the present invention.

The double and triple transfer gates can effectively reduce the generation of the photo-generated electron dead zone, so that efficiency on photo-generated electron transferring can be improved. Also, a dynamic range of the CMOS image sensor can be also improved by decreasing the total capacitance of the floating diffusion regions. Furthermore, it is possible to increase a fill-factor by modifying a layout of the unit pixel of the CMOS image sensor such that the photodiode occupies mostly the bottom region of the unit pixel.

While the present invention has been described with respect to certain preferred embodiments, it will be apparent to those skilled in the art that various changes and modifications may be made without departing from the scope of the invention as defined in the following claims.

What is claimed is:

1. A unit pixel of a complementary metal oxide semiconductor (CMOS) image sensor, the unit pixel comprising:
   a photodiode region disposed in entire areas of a bottom region of the unit pixel;
   a reset gate, a drive gate and a selection gate disposed in an upper part of a top region of the unit pixel;
   a plurality of floating diffusion regions disposed with a uniform size at least at two corners of the photodiode region; and
   a transfer gate disposed in the photodiode region to define the floating diffusion regions,
   wherein the unit pixel has a rectangular shape and is defined with the top region and the bottom region, and an area of the bottom region is larger than an area of the top region, and
   wherein the photodiode region has a rectangular shape by having a first side contacting to the top region, a second and a third sides, each contacting to each end of the first side, and a fourth side connecting the second side to the third side; and
   the floating diffusion regions include a first region formed at a corner in which the second side and the fourth side meet, a second region formed in a corner at which the third side and the fourth side meet, and a third region formed at a corner in which the first side and the third side meet.

2. The unit pixel of the CMOS image sensor as recited in claim 1, wherein the floating diffusion regions are formed at corners of the photodiode region except for a junction region between the photodiode region and the top region.

3. The unit pixel of the CMOS image sensor as recited in claim 1, wherein the transfer gate connects a floating diffusion contact to the floating diffusion region and the floating diffusion contact is connected to the drive gate.

* * * * *